(12) United States Patent
Mariottini et al.

(10) Patent No.: US 10,886,244 B2
(45) Date of Patent: Jan. 5, 2021

(54) COLLARS FOR UNDER-BUMP METAL STRUCTURES AND ASSOCIATED SYSTEMS AND METHODS

(71) Applicant: Micron Technology, Inc., Boise, ID (US)

(72) Inventors: Giorgio Mariottini, Boise, ID (US);
Sameer Vadhavkar, Boise, ID (US);
Wayne Huang, Boise, ID (US);
Anilkumar Chandolu, Boise, ID (US);
Mark Bossier, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 163 days.

(21) Appl. No.: 15/684,054

(22) Filed: Aug. 23, 2017

(65) Prior Publication Data
US 2017/0352633 A1    Dec. 7, 2017

Related U.S. Application Data

(62) Division of application No. 14/853,807, filed on Sep. 14, 2015, now Pat. No. 9,780,052.

(51) Int. Cl.
*H01L 23/00*     (2006.01)
*H01L 21/48*     (2006.01)

(52) U.S. Cl.
CPC ............ *H01L 24/05* (2013.01); *H01L 21/481* (2013.01); *H01L 24/03* (2013.01); *H01L 24/11* (2013.01);
(Continued)

(58) Field of Classification Search
CPC ......... H01L 24/03; H01L 24/05; H01L 24/13; H01L 2224/03013; H01L 2224/0346;
(Continued)

(56) References Cited

U.S. PATENT DOCUMENTS

| 5,736,456 A | 4/1998 | Akram |
| 8,039,385 B1 | 10/2011 | West et al. |

(Continued)

FOREIGN PATENT DOCUMENTS

| CN | 102201375 A | 9/2011 |
| JP | 2009231682 A | 10/2009 |

(Continued)

OTHER PUBLICATIONS

Search Report dated Oct. 20, 2016 in International Application No. PCT/US2016/045255, 13 pages.
(Continued)

*Primary Examiner* — Dzung Tran
(74) *Attorney, Agent, or Firm* — Perkins Coie LLP

(57) ABSTRACT

The present technology is directed to manufacturing collars for under-bump metal (UBM) structures for die-to-die and/or package-to-package interconnects and associated systems. A semiconductor die includes a semiconductor material having solid-state components and an interconnect extending at least partially through the semiconductor material. An under-bump metal (UBM) structure is formed over the semiconductor material and is electrically coupled to corresponding interconnects. A collar surrounds at least a portion of the side surface of the UBM structure, and a solder material is disposed over the top surface of the UBM structure.

11 Claims, 12 Drawing Sheets

(52) U.S. Cl.
CPC ...... *H01L 24/13* (2013.01); *H01L 2224/0219* (2013.01); *H01L 2224/02135* (2013.01); *H01L 2224/02166* (2013.01); *H01L 2224/03013* (2013.01); *H01L 2224/0345* (2013.01); *H01L 2224/0346* (2013.01); *H01L 2224/0348* (2013.01); *H01L 2224/0361* (2013.01); *H01L 2224/03472* (2013.01); *H01L 2224/03906* (2013.01); *H01L 2224/03912* (2013.01); *H01L 2224/0401* (2013.01); *H01L 2224/05007* (2013.01); *H01L 2224/0508* (2013.01); *H01L 2224/05009* (2013.01); *H01L 2224/0569* (2013.01); *H01L 2224/05082* (2013.01); *H01L 2224/05144* (2013.01); *H01L 2224/05147* (2013.01); *H01L 2224/05155* (2013.01); *H01L 2224/05166* (2013.01); *H01L 2224/05181* (2013.01); *H01L 2224/05184* (2013.01); *H01L 2224/05547* (2013.01); *H01L 2224/05553* (2013.01); *H01L 2224/05555* (2013.01); *H01L 2224/05565* (2013.01); *H01L 2224/05566* (2013.01); *H01L 2224/05568* (2013.01); *H01L 2224/05573* (2013.01); *H01L 2224/05686* (2013.01); *H01L 2224/05687* (2013.01); *H01L 2224/10126* (2013.01); *H01L 2224/10145* (2013.01); *H01L 2224/1146* (2013.01); *H01L 2224/11472* (2013.01); *H01L 2224/11906* (2013.01); *H01L 2224/13018* (2013.01); *H01L 2224/13023* (2013.01); *H01L 2224/13026* (2013.01); *H01L 2224/13083* (2013.01); *H01L 2224/13109* (2013.01); *H01L 2224/13111* (2013.01); *H01L 2224/13147* (2013.01); *H01L 2224/13155* (2013.01); *H01L 2224/94* (2013.01); *H01L 2924/014* (2013.01); *H01L 2924/07025* (2013.01); *H01L 2924/3651* (2013.01)

(58) Field of Classification Search
CPC ............. H01L 2224/0401; H01L 21/05; H01L 21/481; H01L 24/11; H01L 2224/2224; H01L 2924/07025; H01L 2924/3651
USPC .................................. 257/737; 438/618, 642
See application file for complete search history.

(56) References Cited

U.S. PATENT DOCUMENTS

| | | |
|---|---|---|
| 2002/0105074 A1 | 8/2002 | Akram et al. |
| 2002/0185733 A1 | 12/2002 | Chow et al. |
| 2004/0166661 A1* | 8/2004 | Lei .......................... H01L 24/03 438/614 |
| 2006/0035416 A1 | 2/2006 | Savastiouk et al. |
| 2008/0283282 A1 | 11/2008 | Kawasaki et al. |
| 2009/0120679 A1 | 5/2009 | Andry et al. |
| 2009/0149016 A1 | 6/2009 | Park et al. |
| 2009/0197114 A1* | 8/2009 | Shih ..................... B23K 1/0016 428/647 |
| 2010/0032764 A1 | 2/2010 | Andry et al. |
| 2010/0090318 A1* | 4/2010 | Hsu ................... H01L 21/76898 257/621 |
| 2010/0109159 A1* | 5/2010 | Ho .......................... H01L 24/11 257/737 |
| 2010/0213608 A1 | 8/2010 | Lau et al. |
| 2011/0068437 A1 | 3/2011 | Chiu et al. |
| 2011/0227216 A1* | 9/2011 | Tseng ..................... H01L 24/05 257/737 |
| 2011/0233761 A1 | 9/2011 | Hwang et al. |
| 2011/0266667 A1 | 11/2011 | Wu et al. |
| 2011/0281432 A1* | 11/2011 | Farooq ............. H01L 21/76807 438/624 |
| 2012/0012997 A1 | 1/2012 | Shen et al. |
| 2012/0235296 A1 | 9/2012 | West et al. |
| 2012/0273945 A1* | 11/2012 | Chang ..................... H01L 24/11 257/737 |
| 2013/0087908 A1 | 4/2013 | Yu et al. |
| 2013/0299972 A1 | 11/2013 | Liu et al. |
| 2014/0077367 A1 | 3/2014 | Arvin et al. |
| 2014/0363970 A1 | 12/2014 | Hwang et al. |
| 2015/0294948 A1 | 10/2015 | Ayotte et al. |
| 2017/0077052 A1 | 3/2017 | Bossler et al. |

FOREIGN PATENT DOCUMENTS

| | | |
|---|---|---|
| JP | 2013538466 A | 10/2013 |
| TW | 201112377 A | 4/2011 |

OTHER PUBLICATIONS

TW Patent Application No. 105125525—English Translation of Taiwanese Office Action dated May 2, 2017 (5 pages).
Extended European Search Report dated Mar. 3, 2019 for European Patent Application No. 16847008.6, 14 pages.
Notice of Reasons for Rejection dated Nov. 27, 2019 for Korean Patent Application No. 10-2015-7010541, 16 pages (with translation).
Notice of Rejection Ground dated May 22, 2019 for Japanese Patent Application No. 2018-512974, 11 pages (with translation).
Notice of Rejection Ground dated Oct. 1, 2019 for Japanese Patent Application No. 2018-512974, 6 pages (with translation).
Office Action dated Jun. 28, 2020 for Chinese Patent Application No. 201680053250.9 21 pages with translation.

* cited by examiner

COLLARS FOR UNDER-BUMP METAL STRUCTURES AND ASSOCIATED SYSTEMS AND METHODS

CROSS-REFERENCE TO RELATED APPLICATION

This application is a divisional of U.S. application Ser. No. 14/853,807 filed Sep. 14, 2015, now U.S. Pat. No. 9,780,052, which is incorporated herein by reference in its entirety.

TECHNICAL FIELD

The present technology is directed generally to semiconductor devices, and in several embodiments more particularly to under-bump metal (UBM) structures for die-to-die and/or package-to-package interconnects.

BACKGROUND

Microelectronic devices, such as memory devices, microprocessors, and light emitting diodes, typically include one or more semiconductor dies mounted to a substrate and encased in a plastic protective covering. Semiconductor dies include functional features, such as memory cells, processor circuits, and interconnecting circuitry. Semiconductor dies also typically include bond pads electrically coupled to the functional features. The bond pads are electrically connected to pins or other types of terminals that extend outside the protective covering for connecting the semiconductor die to busses, circuits, or other assemblies.

Semiconductor die manufacturers are under increasing pressure to reduce the volume occupied by the die and yet increase the capacity and/or speed of the resulting encapsulated assemblies. To meet these demands, semiconductor die manufacturers often stack multiple dies on top of each other to increase the capacity or performance of the device within the limited volume on the circuit board or other element to which the dies are mounted. In many applications, the dies are stacked on each other before being encapsulated to form a three-dimensional package.

The stacked semiconductor dies are typically electrically connected by solder bumps or other electrical connectors that are attached to under-bump metal (UBM) structures. The UBM structures are typically formed by depositing a copper seed structure onto a wafer, forming a mask on the copper seed structure having openings aligned with bond pads on the die, plating copper onto the seed structure, and then plating one or more other materials over the copper to form UBM structures. The top-most material of the UBM structure is typically selected to promote wetting for subsequently forming interconnects on the top-most material. After forming the UBM structures, microbumps of solder material are formed over the top-most material of the UBM structures to serve as interconnects. After forming the UBM structures and microbumps, the mask is removed and the exposed portions of the seed structure are removed using a suitable wet etch to form isolated UBM structures and microbumps. The present technology is directed to improved UBM structures and methods of manufacturing UBM structures.

BRIEF DESCRIPTION OF THE DRAWINGS

Many aspects of the present technology can be better understood with reference to the following drawings. The components in the drawings are not necessarily to scale, but instead emphasis is placed on clearly illustrating the principles of the present technology.

DETAILED DESCRIPTION

Figure 1:
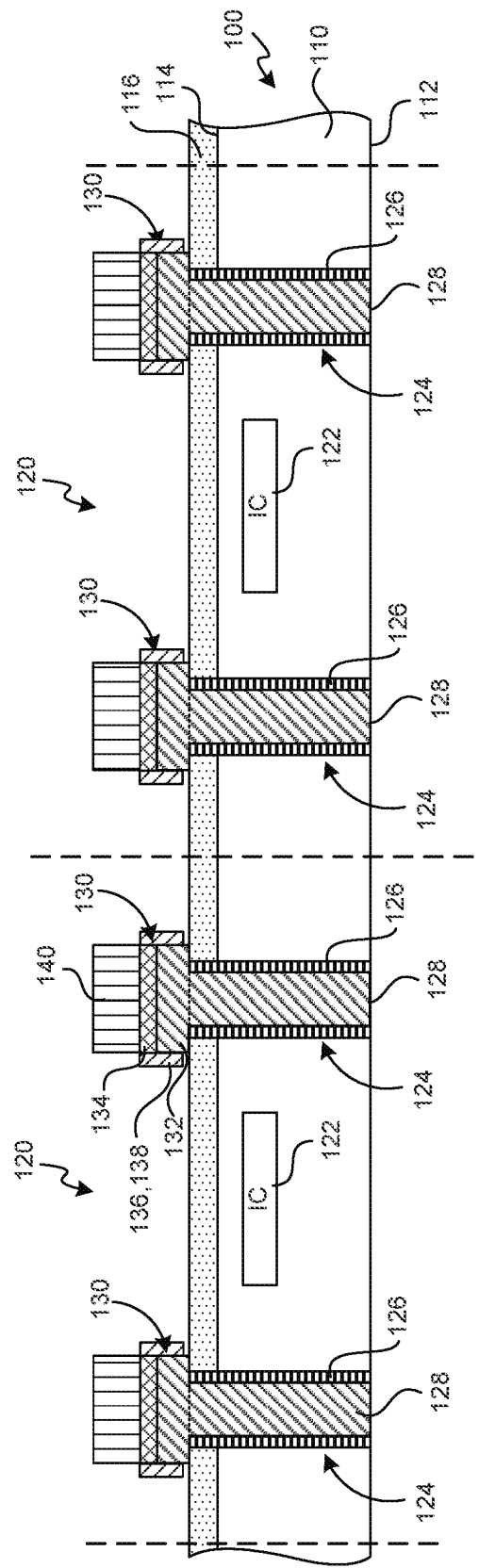
FIG. 1 is a cross-sectional view of a substrate assembly schematically showing a plurality of semiconductor dies in accordance with an embodiment of the present technology.

Specific details of several embodiments of methods for making semiconductor devices are described herein along with related devices and systems. The term "semiconductor device" generally refers to a solid-state device that includes one or more semiconductor materials. Examples of semiconductor devices include logic devices, memory devices, microprocessors, and diodes among others. Furthermore, the term "semiconductor device" can refer to a finished device or to an assembly or other structure at various stages of processing before becoming a finished device. Depending upon the context in which it is used, the term "substrate" can refer to a wafer-level substrate or to a singulated, die-level substrate. A person having ordinary skill in the relevant art will recognize that suitable steps of the methods described herein can be performed at the wafer level or at the die level. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, spin coating, and/or other suitable techniques. Similarly, materials can be removed, for example, using plasma etching, wet etching, chemical-mechanical planarization, or other suitable techniques.

Many embodiments of the present technology are described below in the context of UBM structures that are electrically coupled to TSVs, such as through-silicon vias that have electrically conductive plugs or connectors which extend completely through the substrate and/or packaging material when completed. A person having ordinary skill in the relevant art will also understand that the present technology may include embodiments for forming UBM structures on either the first side or the second side of a substrate assembly, and the UBM structures may be used in the context of other electrical connectors associated with a semiconductor assembly. The present technology may accordingly be practiced without several of the details of the embodiments described herein with reference to FIGS. 1-6. For ease of reference, identical reference numbers are used to identify similar or analogous components or features throughout this disclosure, but the use of the same reference number does not imply that the features should be construed to be identical. Indeed, in many examples described herein, identically numbered features have a plurality of embodiments that are distinct in structure and/or function from each other. Furthermore, the same shading may be used to indicate materials in cross section that can be compositionally similar, but the use of the same shading does not imply that the materials should be construed to be identical unless specifically noted herein.

UBM structures and microbumps are attached to an adjacent die using reflow processes. During reflow of a microbump disposed on top of a UBM structure, some material of the microbump (e.g., tin) may react with material of the UBM structure (e.g., copper), which can deleteriously affect the interconnection between the UBM structure and the adjacent die. For example, some of the material from the microbump can out-flow due to sidewall wetting along the UBM structure. This can lead to formation of an intermetallic compound on the microbump sidewall. Additionally, some of the microbump material (e.g., tin) can diffuse until reaching and reacting with the UBM structure material (e.g., copper), resulting in molar volume shrinkage for the available tin in the microbump, also referred to as solder starvation. These two effects can result in depletion of un-reacted solder material available at the center of the microbump, causing voids in the solder joint and reducing the electromigration reliability.

Several embodiments of the present technology significantly reduce the possibility for solder material of a microbump to react with material of a UBM structure during reflow of the microbump. For example, several embodiments of the present technology form a collar around at least a portion of the first material and/or the second material of the UBM structure that protects the UBM sidewalls from reacting with solder from the microbump. Several embodiments of the present technology accordingly reduce the reaction between the microbumps and UBM sidewalls during microbump reflow as explained in more detail below.

FIG. 1 is a cross-sectional view that schematically illustrates a substrate assembly 100 having a semiconductor material 110 with a first side 112 and a second side 114. The substrate assembly 100 further includes a dielectric material 116 on the second side 114 of the semiconductor material 110. A plurality of semiconductor dies 120 are formed at discrete areas of the substrate assembly 100. Although two semiconductor dies 120 are illustrated in FIG. 1, in practice the semiconductor assembly 100 typically has several hundred or even over 1,000 individual semiconductor dies. The individual semiconductor dies 120 can include integrated circuitry 122 and a plurality of interconnects 124 electrically coupled to the integrated circuitry 122. In the embodiment shown in FIG. 1, the interconnects 124 are TSVs that include a dielectric liner 126 and a conductive plug 128 within the dielectric liner 126. The interconnects 124 can accordingly extend completely through the substrate assembly 100.

The semiconductor dies 120 further include a plurality of UBM structures 130, and individual UBM structures 130 are electrically coupled to corresponding interconnects 124. In several embodiments, the individual UBM structures 130 comprise a first material 132 electrically coupled to one of the interconnects 124 and a second material 134 over the first material 132. An anti-wetting material 136 forms a collar 138 around at least a portion of the first material 132 and the second material 134. The semiconductor dies 120 can also include microbumps 140 over the second material 134 of individual UBM structures 130.

In a particular embodiment, the first material 132 comprises copper, the second material 134 comprises nickel, the microbump 140 comprises a tin-silver solder material, and the collar 138 comprises an oxide, for example tetraethyl orthosilicate (TEOS) or another oxide. This embodiment forms a Cu/Ni UBM structure 130 with a microbump 140 formed thereover and an oxide collar surrounding the exposed sidewall of the Ni and at least a portion of the Cu without covering the top surface of the UBM structure 130 (e.g., the top surface of the second material 134). In other embodiments, the first and second materials 132 and 134 can comprise any electrically conductive material, for example, gold, silicon, tungsten, etc. The shape and dimension of the UBM structure 130 can vary. For example, in some embodiments, the UBM structure 130 is substantially cylindrical, forming a pillar-like structure, but the UBM structure 130 can have other cross-sectional shapes in other embodiments, for example rectangular, regular polygonal, irregular polygonal, elliptical, etc. The UBM structure 130 can have a thickness of between about 1-100 microns and can have a height of between about 1-100 microns.

The microbump 140 can comprise a solder material, for example tin-silver, indium, or another suitable solder material for forming an electrical and mechanical connection between the UBM structure 130 and an adjacent die. The anti-wetting material 136 forming the collar 138 can, in some embodiments, comprise a material that prevents wetting of the microbump 140 on the sidewall of the first and second materials 132 and 134 (e.g., the anti-wetting material 136 provides a non-wettable surface for the material of the microbump 140). The anti-wetting material 136 can have a diffusability for the solder material of the microbump 140 that is extremely low or negligible. For example, in some embodiments, the anti-wetting material 136 comprises an oxide, a nitride, or polyimide. In some embodiments, the anti-wetting material 136 has a thickness of between about 1000-5000 Å, or in some embodiments between about 2000-2500 Å. In several embodiments, the anti-wetting material 136 completely surrounds at least a portion of the circumference of the first and/or second materials 132 and 134, but in other embodiments the anti-wetting material 136 covers less than the full circumference. The anti-wetting material 136 also extends along at least a portion of the height of the UBM structure 130; for example the anti-wetting material 136 covers at least 80% of the height of the UBM structure 130. The collar 138 comprising the anti-wetting material 136 eliminates or reduces wetting of solder from the microbump 140 along the sidewall of the first and second material 132 and 134 of the UBM structure 130. Further embodiments and aspects of forming UBM structures, collars, and microbumps in accordance with the present technology are described below with reference to FIGS. 2A-3G.

Figure 2A:
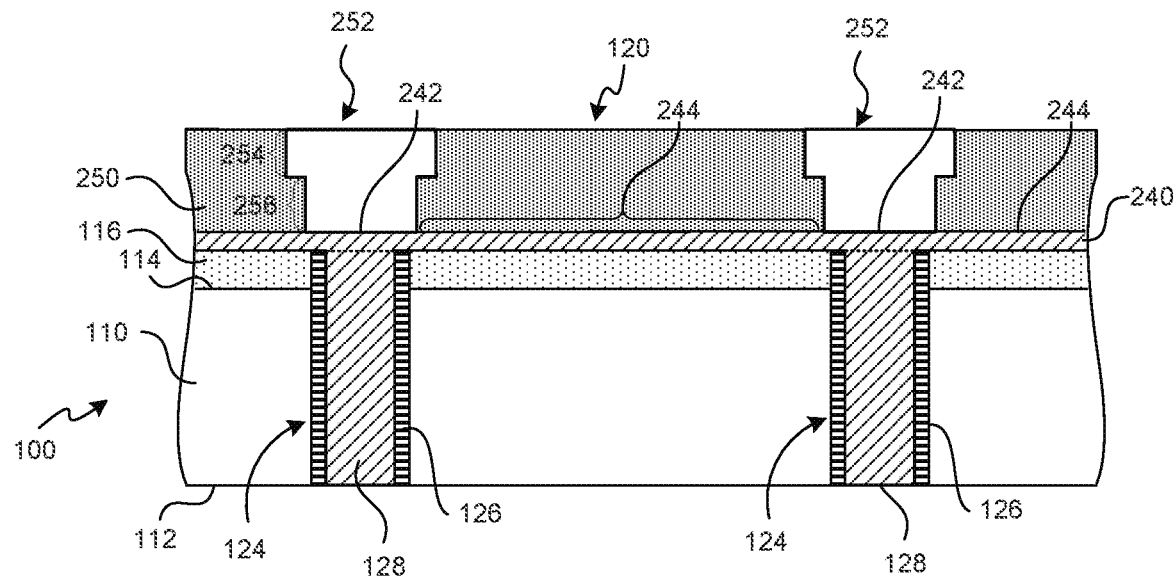
FIGS. 2A-2H are cross-sectional views schematically illustrating a portion of a semiconductor die at various stages of a method in accordance with an embodiment of the present technology.

FIGS. 2A-2H are cross-sectional views schematically illustrating a semiconductor die 120 at a portion of the substrate assembly 100 during different stages of a method for forming UBM structures, collars, and microbumps. Referring to FIG. 2A, at this stage of the method the semiconductor die 120 has a seed structure 240 formed on the dielectric material 116 and the portions of the interconnects 124 proximate to the second side 114 of the substrate 110, and a mask 250 on the seed structure 240. The seed structure 240 can have first areas 242 associated with the location of the interconnects 124 and second areas 244 between the first areas 242. The seed structure 240 can be a single material suitable for plating the base or first material of a UBM structure. In several embodiments, the seed structure 240 includes a barrier material and a seed material on the barrier material. The barrier material can be tantalum, tantalum nitride, titanium, titanium-tungsten or another material that prevents diffusion of the UBM materials into the dielectric material 116 and the substrate 100. The seed material can be copper, a copper alloy, nickel, or other suitable materials for plating the first material 132 (FIG. 1) onto the seed material using electro-plating or electroless-plating techniques known in the art. In practice the seed structure 240 can integrate with the conductive plug 128 of the interconnect 124.

The mask 250 can be a resist material or other suitable mask material having a plurality of openings 252 aligned with the first areas 242 of the seed structure 240. As explained in more detail below, UBM structures are formed in the openings 252 of the mask 250. The openings 252 of the mask 250 have a T-shaped cross-section when viewed from the sides as shown in FIG. 2A, in which an upper portion 254 has a wider opening than a lower portion 256. This T-shaped opening 252 in the mask 250 can be formed using a leaky chrome mask during photolithography or other suitable technique.

Figure 2B:
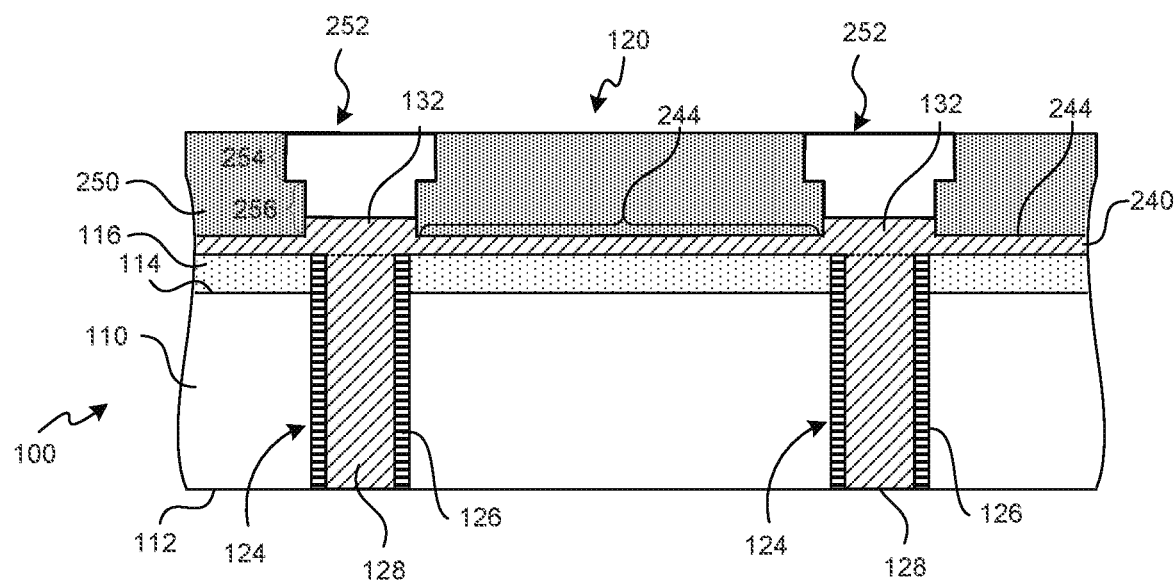

FIG. 2B is a cross-sectional view schematically illustrating the semiconductor die 120 after the first material 132 has been formed on the exposed first area 242 (FIG. 2A) of the seed structure 240. In one embodiment, the seed structure 240 includes a copper seed material deposited using a physical vapor deposition process, and the first material 132 comprises copper deposited onto the copper seed material using an electro-plating or electroless-plating process known in the art. The first material 132 can accordingly define a base material of the UBM structure. In one embodiment, the first material 132 has a first diameter (e.g., 30 μm) and a height (30 μm) at this stage of the process, but the diameter and the height of the first material 132 can have any other suitable dimension according to the specific configuration of the particular semiconductor die 120.

Figure 2C:
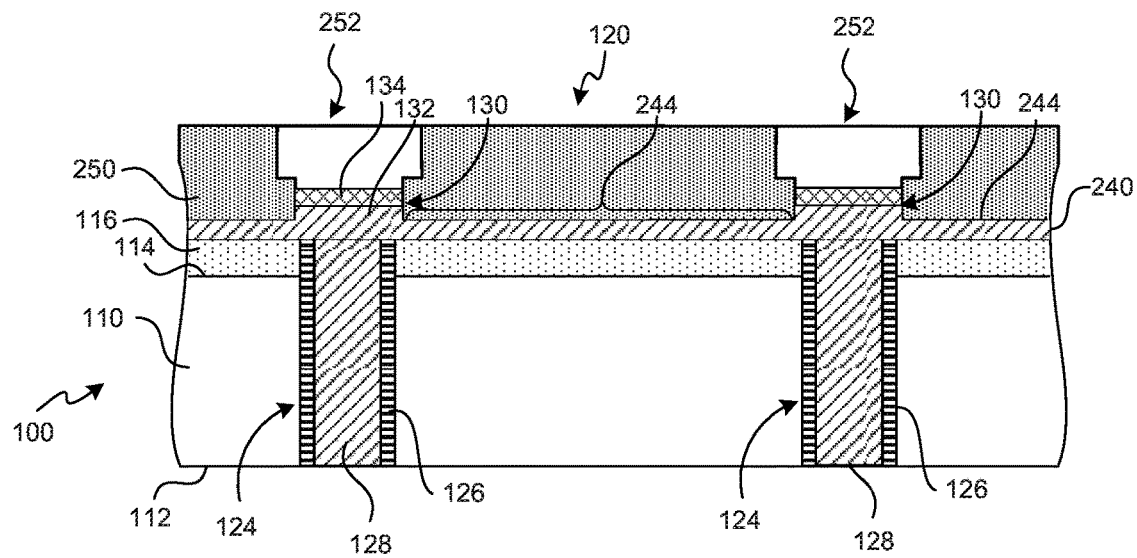

FIG. 2C is a cross-sectional view schematically illustrating the semiconductor die 120 after the second material 134 has been deposited into the openings 252 such that the second material 134 is over the first material 132. The second material 134 can comprise nickel or other suitable materials that provide a good wetting surface for forming interconnects on the second material 134. The first material 132 and second material 134 can define a UBM structure 130. At this stage of the process, the semiconductor die 120 has a plurality of UBM structures 130 that are electrically coupled to each other through the seed structure 240. In some embodiments, the second material can be omitted altogether, and the UBM structure can include only the first material.

Figure 2D:
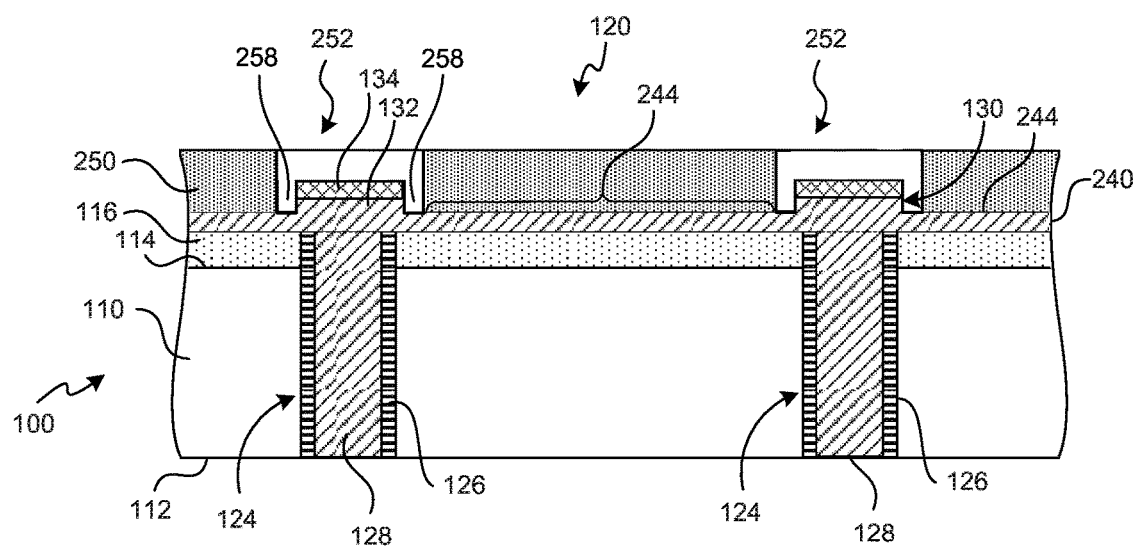

FIG. 2D is a cross-sectional view schematically illustrating the semiconductor die 120 after a portion of the mask 250 has been removed to define collar openings 258 in accordance with one embodiment of the present technology. The mask 250 can be etched using an anisotropic dry etch and dry clean. The dry etch can remove the mask 250 substantially uniformly across the semiconductor die 120 until it is completely removed in the collar openings 258 adjacent the UBM structures 130. The collar openings 258 can define a thickness of the collars 138 (FIG. 1), for example having a thickness of between about 1000-5000 Å, or between about 2000-2500 Å. The parameters of the dry etch (e.g., chemistry, power, temperature, etc.) can be tailored in order to harden the mask 250 during the etch to prepare the mask 250 for subsequent deposition steps.

Figure 2E:
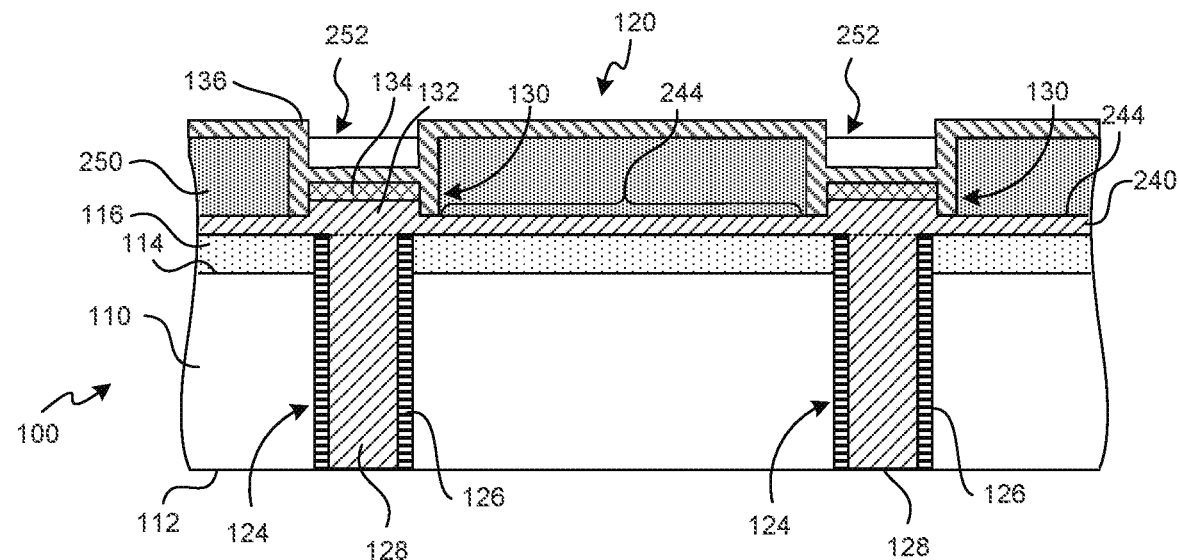

FIG. 2E is a cross-sectional view schematically illustrating the semiconductor die 120 after the anti-wetting material 136 has been formed in accordance with one embodiment of the present technology. The anti-wetting material 136 can be a material to which the solder material of the microbump 140 (FIG. 1) does not readily wet (e.g., cover) in liquid phase and/or has low or negligible diffusability for the solder material of the microbump 140 (FIG. 1). The anti-wetting material 136 can be an oxide, a nitride, polyimide, or other suitable material. In one embodiment, the anti-wetting material 136 is tetraethyl orthosilicate (TEOS) formed by low-temperature (e.g., less than 150° C.) plasma-enhanced chemical vapor deposition or other suitable process. The anti-wetting material 136 is formed as a blanket layer over the mask 250 and the openings 252, including covering the UBM structures 130 and filling the collar openings 258 (FIG. 2D).

Figure 2F:
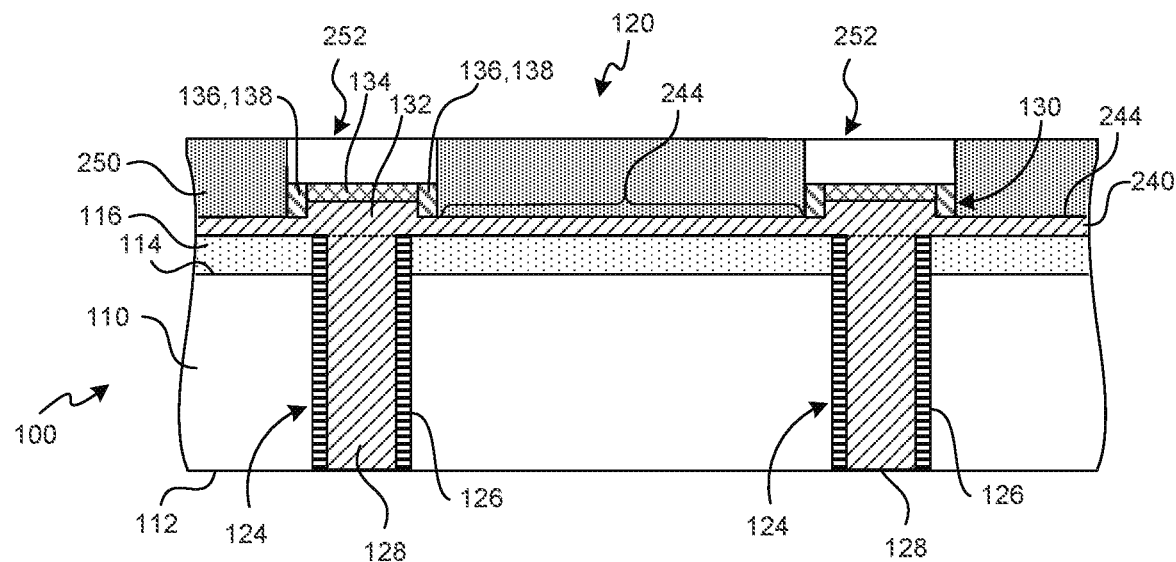

FIG. 2F is a cross-sectional view schematically illustrating the semiconductor die 120 after portions of the anti-wetting material 136 have been removed in accordance with one embodiment of the technology. A buffered oxide etch or a spacer etch followed by a wet clean can be used to remove portions of the anti-wetting material 136. As shown in FIG. 2F, most of the anti-wetting material 136 has been removed until the only remaining portions of the anti-wetting material 136 are in the collar openings 258 (FIG. 2D) to form the collars 138. In some embodiments, the collars 138 can be substantially coplanar with the second material 134, while in other embodiments the collars 138 can be recessed with respect to the second material 134.

Figure 2G:
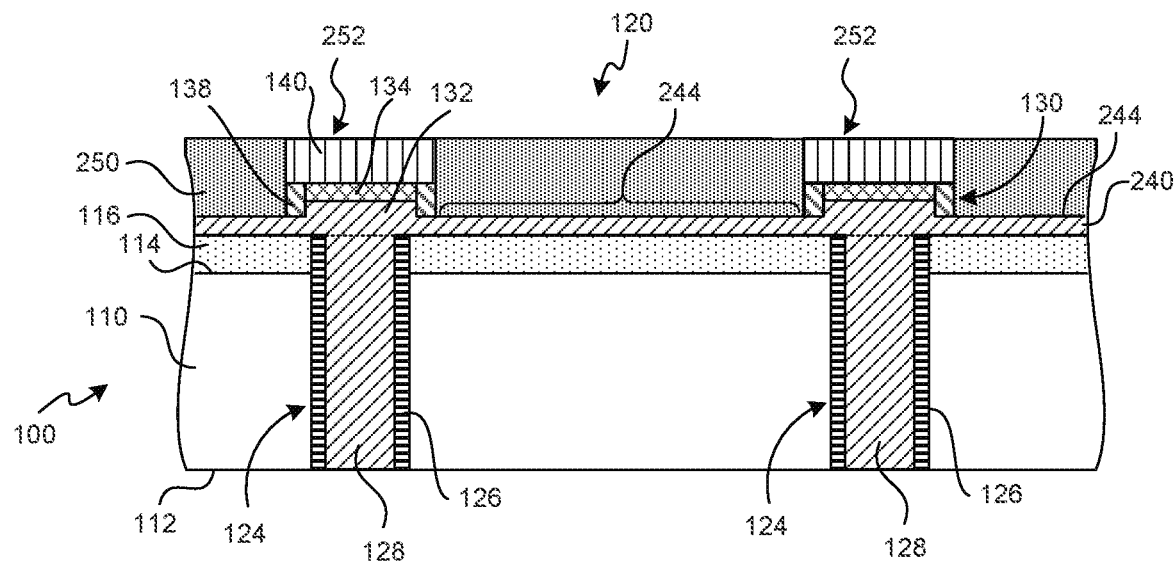

FIG. 2G is a cross-sectional view schematically illustrating the semiconductor die 120 after the microbumps 140 have been formed in accordance with one embodiment of the technology. The microbumps 140 can be formed of solder material, for example tin-silver or indium solder, which is plated into the openings 252 on top of the UBM structure 130 and the collar 138. In some embodiments, the microbumps 140 can have a height of between about 3-50 microns.

Figure 2H:
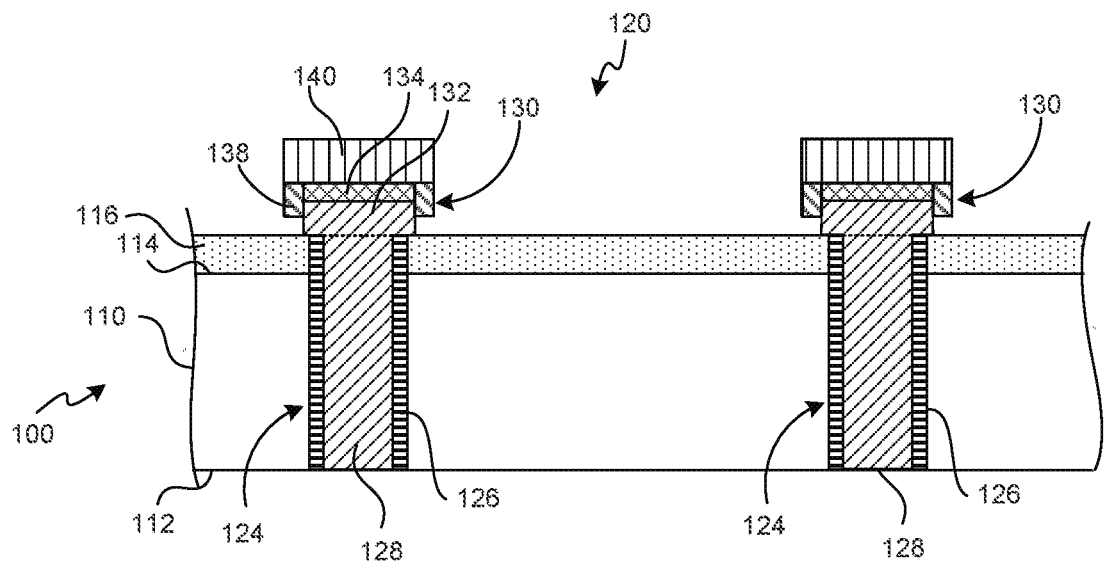

FIG. 2H is a cross-sectional view schematically illustrating the semiconductor die 120 after the mask 250 and portions of the seed structure 240 are removed to electrically isolate the UBM structures 130. The mask 250 can be removed using a wet photoresist strip or other suitable technique, and then the second areas 244 of the seed structure 240 can be removed using a wet etch suitable for removing the materials of the seed structure. At this point, the UBM structures are electrically isolated from each other.

Figure 3A:
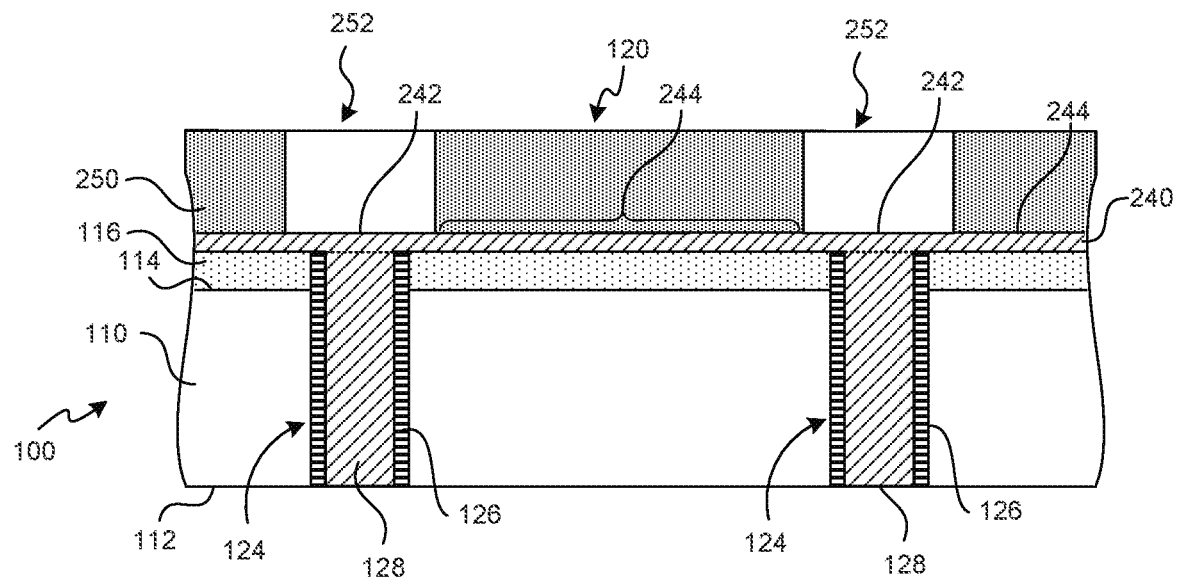
FIGS. 3A-3G are cross-sectional views schematically illustrating a portion of a semiconductor die at various stages of a method in accordance with another embodiment of the present technology.

FIGS. 3A-3G are cross-sectional views schematically illustrating a semiconductor die 120 at a portion of the substrate assembly 100 during different stages of manufacturing UBM structures, collars, and microbumps in accordance with another embodiment of the present technology. Referring to FIG. 3A, at this stage of the method the semiconductor die 120 has the seed structure 240 on the dielectric material 116 and the portions of the interconnects 124 proximate to the second side 114 of the substrate 110, and the mask 250 is on the seed structure 240. The seed structure 240 has first areas 242 associated with the location of the interconnects 124 and second areas 244 between the first areas 242. The mask 250 can be a resist material or other suitable mask material having a plurality of openings 252 aligned with the first areas 242 of the seed structure 240. As explained in more detail below, UBM structures are formed in the openings 252 of the mask 250.

Figure 3B:
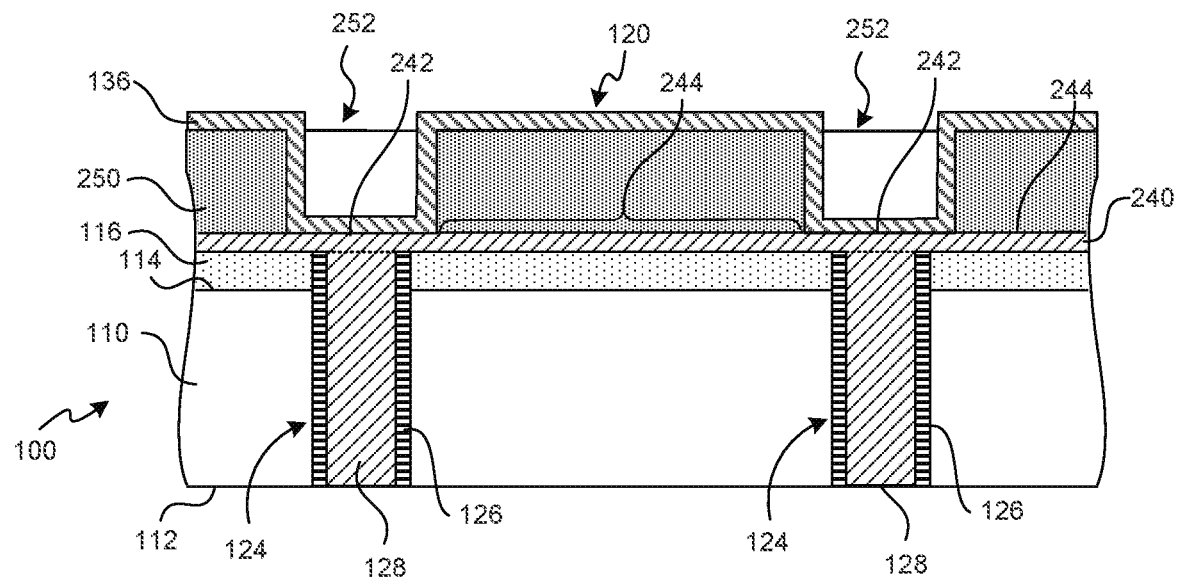

FIG. 3B is a cross-sectional view schematically illustrating the semiconductor die 120 after the anti-wetting material 136 has been formed in accordance with one embodiment of the present technology. The anti-wetting material 136 can be a material to which the solder material of the microbump 140 (FIG. 1) does not readily wet (e.g., cover) in liquid phase and/or has low or negligible diffusability for the solder material of the microbump 140 (FIG. 1). The anti-wetting material 136 can be an oxide (e.g., tetraethyl orthosilicate (TEOS) or other oxide), a nitride, polyimide, or other suitable material. In one embodiment, the anti-wetting material 136 is tetraethyl orthosilicate (TEOS) formed by low-temperature (e.g., less than 150° C.) plasma-enhanced chemical vapor deposition or other suitable process. The anti-wetting material 136 is formed as a blanket layer over the mask 250 and the openings 252.

Figure 3C:
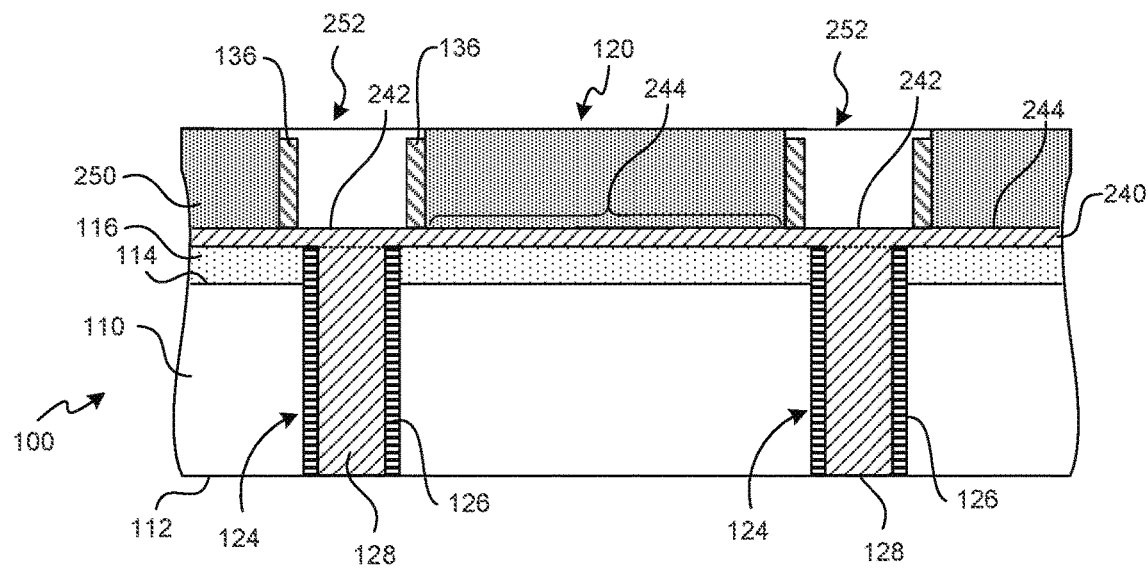

FIG. 3C is a cross-sectional view schematically illustrating the semiconductor die 120 after portions of the anti-wetting material 136 have been removed in accordance with one embodiment of the technology. A spacer oxide etch followed by a wet clean can be used to remove portions of the anti-wetting material 136. As shown in FIG. 3C, the overlying portions of the anti-wetting material 136 have been removed until the only remaining portions of the anti-wetting material 136 are along sidewalls of the openings 252.

Figure 3D:
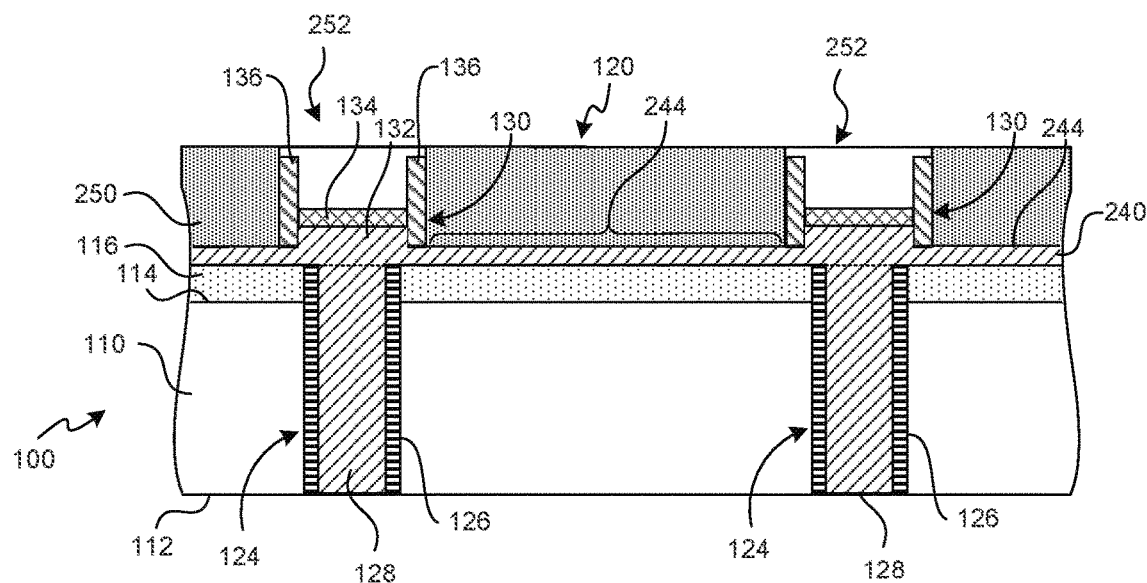

FIG. 3D is a cross-sectional view schematically illustrating the semiconductor die 120 after the first material 132 has been formed on the exposed first areas 242 (FIG. 3C) of the seed structure 240 and the second material 134 has been formed over the first material 132. In one embodiment, the seed structure 240 includes a copper seed material deposited using a physical vapor deposition process, and the first material 132 comprises copper deposited onto the copper seed material using an electro-plating or electroless-plating process known in the art. The first material 132 and second material 134 can define a UBM structure 130 surrounded by the anti-wetting material 136. At this stage of the process, the semiconductor die 120 has a plurality of UBM structures 130 that are electrically coupled to each other through the seed structure 240. In some embodiments, the second material can be omitted altogether, and the UBM structure can include only the first material.

Figure 3E:
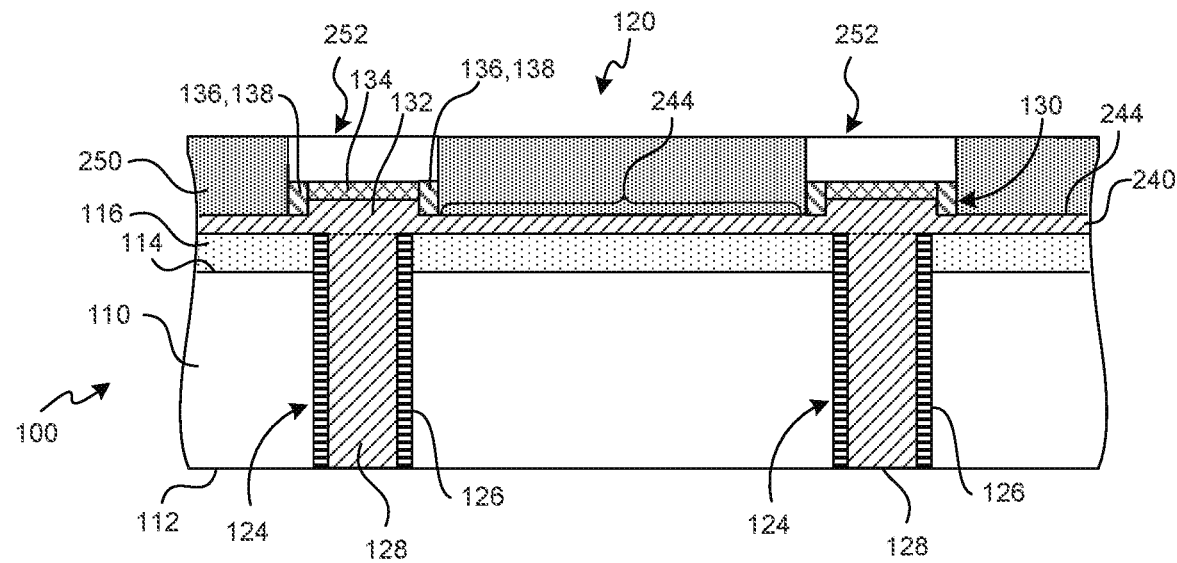

FIG. 3E is a cross-sectional view schematically illustrating the semiconductor die 120 after further portions of the anti-wetting material 136 have been removed to form the collars 138. Similar to the process described above with respect to FIG. 3B, the additional portions of the anti-wetting material 136 can be removed using a spacer oxide etch followed by a wet clean. As shown in FIG. 3E, the anti-wetting material 136 has been removed until the only remaining anti-wetting material 136 along sidewalls of the openings 252 is substantially coplanar with the second material 134 and thereby forms the collar 138.

Figure 3F:
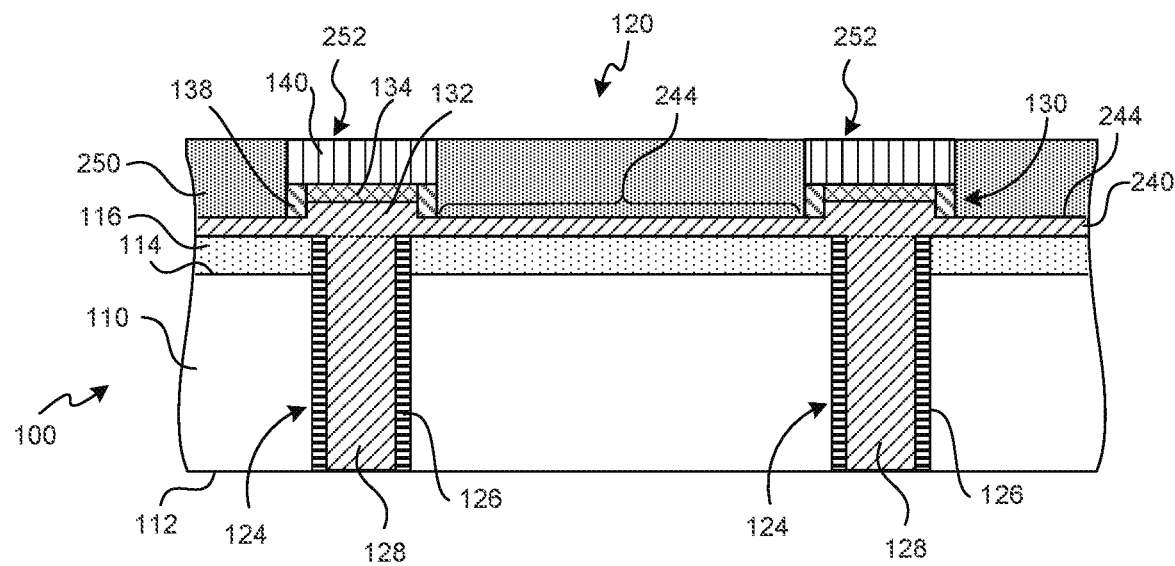

FIG. 3F is a cross-sectional view schematically illustrating the semiconductor die 120 after the microbumps 140 have been formed. The microbumps 140 can be formed of solder material, for example tin-silver or indium solder, which is plated into the openings 252 on top of the UBM structure 130 and the collar 138. In some embodiments, the microbumps 140 can have a height of between about 3-50 microns.

Figure 3G:
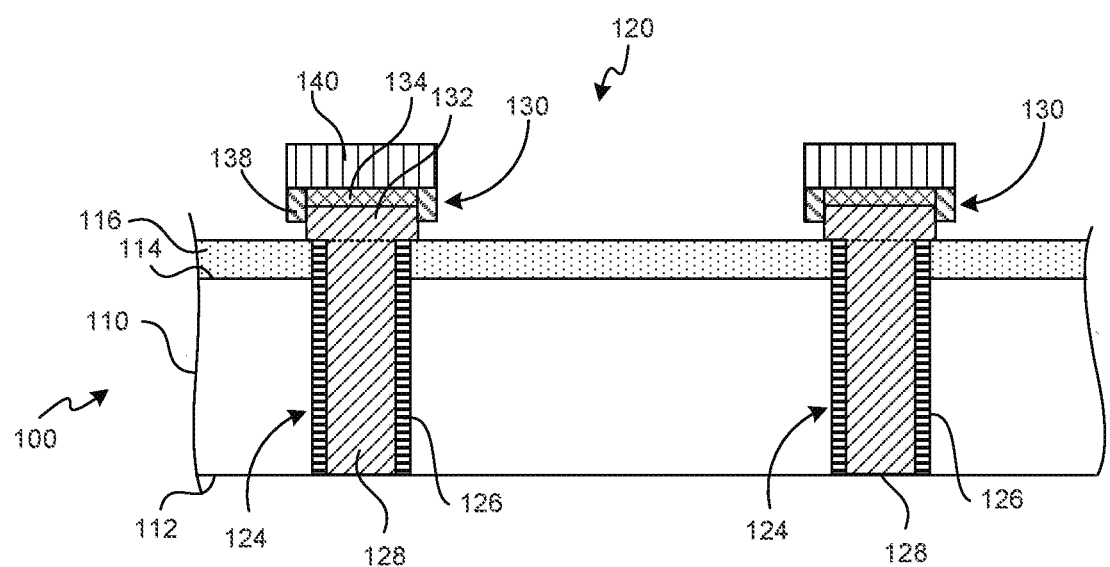

FIG. 3G is a cross-sectional view schematically illustrating the semiconductor die 120 after the mask 250 and seed structure 240 are removed to electrically isolate the UBM structures 130. The mask 250 can be removed using a wet photoresist strip or other suitable technique, and then the second areas 244 of the seed structure 240 can be removed using a suitable wet etch to electrically isolate the UBM structures 130 from each other.

Figure 4:
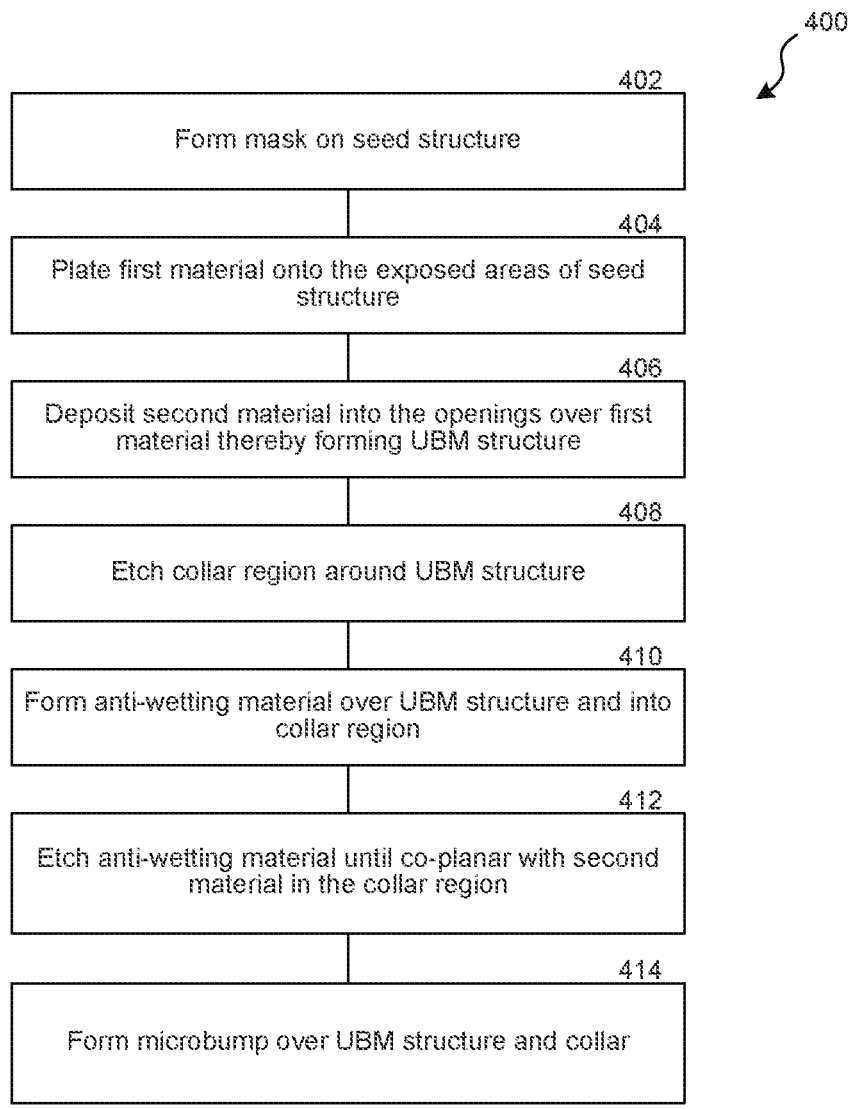
FIG. 4 is a flow chart of a method in accordance with an embodiment of the present technology.

FIG. 4 is a flow chart of an embodiment of a method 400 for forming UBM structures on a semiconductor die in accordance with an embodiment of the present technology. In this embodiment, the method 400 includes forming a mask on a seed structure (block 402) and plating a first material onto the exposed areas of the seed structure (block 404). The mask, for example, has openings that expose areas of the seed structure which are electrically coupled to interconnects that extend at least partially through a semiconductor substrate. In several embodiments, the openings of the mask are superimposed over TSVs. The method 400 further includes depositing a second material into the openings over the first material thereby forming a UBM structure (block 406), and etching a collar region around the UBM structure (block 408). The method continues by forming an anti-wetting material over the UBM structure and into the collar region (block 410), followed by etching the anti-wetting material until it is substantially co-planar with the second material in the collar region (block 412). This step forms a collar surrounding the UBM structure. The method 400 continues by forming a microbump over the UBM structure (block 414). The mask can then be removed, followed by removal of the exposed portions of the seed structure between the UBM structures by wet etching.

Figure 5:
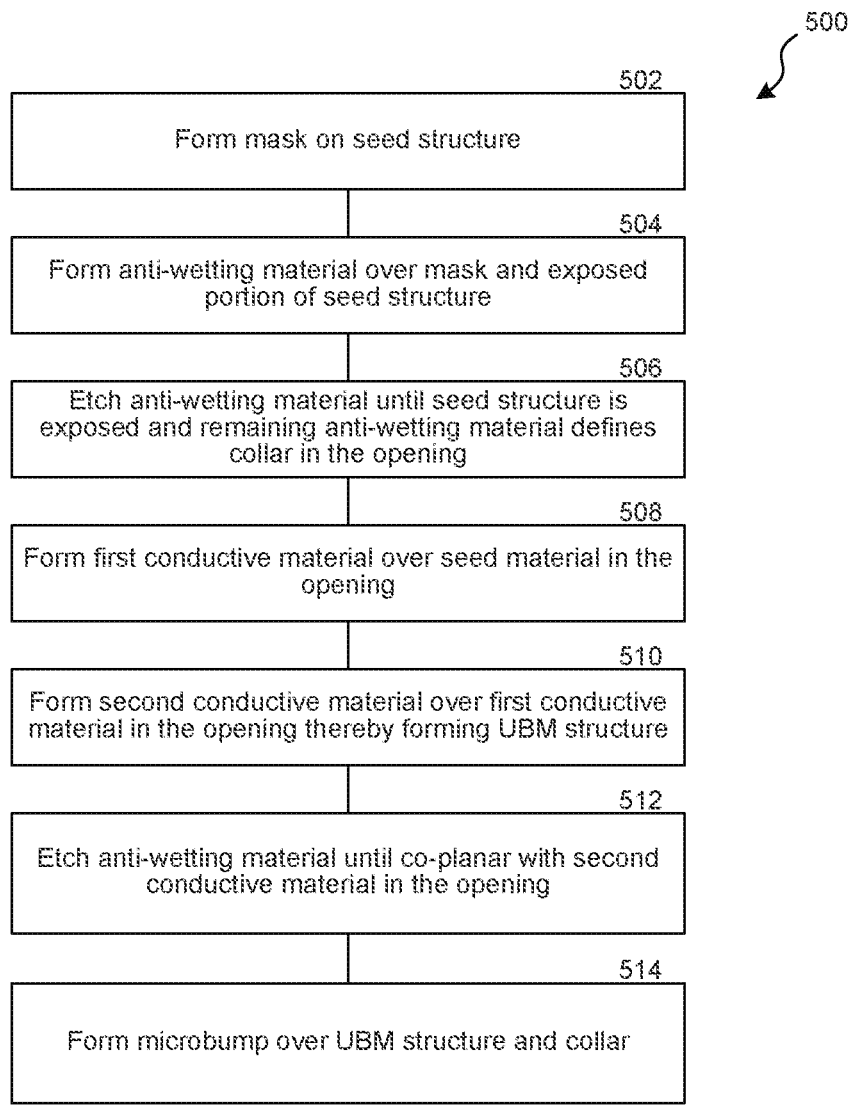
FIG. 5 is a flow chart of a method in accordance with an embodiment of the present technology.

FIG. 5 is a flow chart of an embodiment of a method 500 for forming UBM structures on a semiconductor die in accordance with an embodiment of the present technology. In this embodiment, the method 500 includes forming a mask on a seed structure (block 502) and forming an anti-wetting material over the mask and the exposed portions of the seed material (block 504). The mask, for example, has openings that expose areas of the seed structure which are electrically coupled to interconnects that extend at least partially through a semiconductor substrate. In several embodiments, the openings of the mask are superimposed over TSVs. The method 500 further includes etching the anti-wetting material until the seed structure is exposed and the remaining anti-wetting material defines a collar in the openings (block 506). For example, the anti-wetting material can be etched using a buffered oxide etch or a spacer etch followed by a wet clean. The method 500 continues by plating a first material over the seed material in the opening (block 508) and forming a second conductive material over the first conductive material in the opening, thereby forming a UBM structure (block 510). The method 500 then removes the anti-wetting material until the collar is substantially coplanar with the second conductive material in the opening (block 512). The method 500 continues by forming a microbump over the UBM structure (block 514). The mask can then be removed, followed by removal of the exposed portions of the seed structure between the UBM structures by wet etching.

Figure 6:
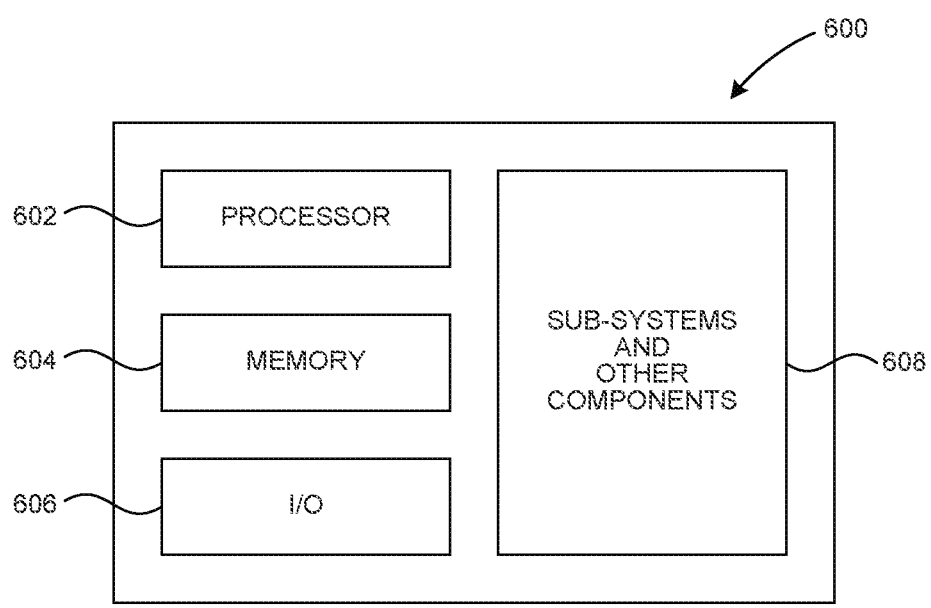
FIG. 6 is a block diagram illustrating a system that incorporates a semiconductor device in accordance with an embodiment of the present technology.

Any one of the semiconductor devices having the features described above with reference to FIGS. 1-5 can be incorporated into any of a myriad of larger and/or more complex systems, a representative example of which is system 600 shown schematically in FIG. 6. The system 600 can include a processor 602, a memory 604 (e.g., SRAM, DRAM, flash, and/or other memory devices), input/output devices 606, and/or other subsystems or components 608. The semiconductor device 100 described above with reference to FIGS. 1-5 can be included in any of the elements shown in FIG. 6. The resulting system 600 can be configured to perform any of a wide variety of suitable computing, processing, storage, sensing, imaging, and/or other functions. Accordingly, representative examples of the system 600 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 600 include lights, cameras, vehicles, etc. With regard to these and other example, the system 600 can be housed in a single unit or distributed over multiple interconnected units, e.g., through a communication network. The components of the system 600 can accordingly include local and/or remote memory storage devices and any of a wide variety of suitable computer-readable media.

From the foregoing, it will be appreciated that specific embodiments of the invention have been described herein for purposes of illustration, but that various modifications may be made without deviating from the scope of the invention. Accordingly, the invention is not limited except as by the appended claims.

We claim:

1. A method comprising:
   forming an under-bump metal (UBM) structure, wherein forming the UBM structure comprises: forming a mask on a seed structure, wherein the mask has an opening that exposes an area of the seed structure that is electrically coupled to an interconnect that extends at least partially through a semiconductor substrate; plating a first material onto the exposed area of the seed structure; and depositing a second material into the opening over the first material;
   forming a collar from an anti-wetting material, wherein the collar surrounds at least a portion of a sidewall of the UBM structure without covering a top surface of the UBM structure, wherein the collar surrounds a portion, but not all, of the first conductive material and a portion of the second conductive material, and wherein the collar does not contact a semiconductor material of the semiconductor device; and
   disposing a solder material on the top surface of the UBM structure, wherein the solder material does not readily wet to the anti-wetting material when the solder material is in liquid phase.

2. The method of claim 1, further comprising removing at least a portion of the mask thereby exposing portions of the seed structure.

3. The method of claim 2, further comprising removing the exposed portions of the seed structure.

4. The method of claim 1 wherein the first and second materials are conductive, and wherein the anti-wetting material comprises at least one of: a nitride, an oxide, or polyimide.

5. The method of claim 1 wherein the opening in the mask has an upper portion and a lower portion, wherein the upper portion is wider than the lower portion.

6. The method of claim 5, further comprising:
   plating the first material into the lower portion of the opening;
   depositing the second material into the lower portion of the opening over the first material thereby forming the UBM structure in the lower portion;
   removing a portion of the mask to define a collar opening surrounding the UBM structure; and
   forming the collar comprising the anti-wetting material in the collar opening.

7. The method of claim 6, wherein forming the collar comprising the anti-wetting material in the collar opening comprises:
   depositing a blanket layer of the anti-wetting material over the mask and the opening; and
   etching to remove a portion of the anti-wetting material while retaining the anti-wetting material in the collar opening.

8. The method of claim 1, wherein the opening is a first opening, and further comprising:
   forming the collar over the exposed area of the seed structure, the collar defining a second opening.

9. The method of claim 8, further comprising forming the UBM structure by depositing the first material into the second opening and depositing the second material over the first material.

10. The method of claim 8, further comprising:
    depositing the solder material over the collar and the second material;
    removing at least a portion of the mask thereby exposing a portion of the seed structure; and
    removing the exposed portion of the seed structure.

11. The method of claim 8 wherein forming the collar comprises:
    depositing a blanket layer of the anti-wetting material over the mask and the first opening, the anti-wetting material coating interior side surfaces of the opening; and
    performing an anisotropic etch on the anti-wetting material to remove anti-wetting material from a bottom surface of the first opening thereby forming the second opening.

* * * * *